(12) United States Patent
Baumgartner et al.

(10) Patent No.: US 7,360,181 B2
(45) Date of Patent: Apr. 15, 2008

(54) ENHANCED STRUCTURAL REDUNDANCY DETECTION

(75) Inventors: Jason R. Baumgartner, Austin, TX (US); Hari Mony, Austin, TX (US); Viresh Paruthi, Austin, TX (US); Fadi Z. Zaraket, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 11/382,533

(22) Filed: May 10, 2006

(65) Prior Publication Data

US 2007/0266354 A1 Nov. 15, 2007

(51) Int. Cl.
G06F 17/50 (2006.01)
(52) U.S. Cl. ............... 716/2; 716/4; 716/3; 703/15
(58) Field of Classification Search ............ 716/2, 716/4, 3; 703/15
See application file for complete search history.

(56) References Cited

U.S. PATENT DOCUMENTS

| | | | | |
|---|---|---|---|---|
| 6,086,626 | A * | 7/2000 | Jain et al. ............... | 716/5 |
| 6,301,687 | B1 * | 10/2001 | Jain et al. ............... | 716/3 |
| 6,389,374 | B1 * | 5/2002 | Jain et al. ............... | 703/2 |
| 6,594,808 | B1 * | 7/2003 | Kale et al. ............... | 716/8 |
| 7,017,043 | B1 * | 3/2006 | Potkonjak ............... | 713/176 |
| 7,073,141 | B2 * | 7/2006 | Novakovsky et al. ..... | 716/4 |
| 2004/0010759 | A1 * | 1/2004 | Kale et al. ............... | 716/1 |
| 2004/0163070 | A1 * | 8/2004 | Teig et al. ............... | 716/18 |
| 2007/0256037 | A1 * | 11/2007 | Zavadsky et al. ........ | 716/2 |

OTHER PUBLICATIONS

Marwedel et al., "A Technique for Avoiding Isomorphic Netlists in Architectural Synthesis", Proceedings of European Design and Test Conference, Mar. 11-14, 1996, p. 600.*
Liu et al., "Minimal Dimension Realization and Identifiability of Input-Output Sequences", IEEE Transactions on Automatic Conrtol, vol. 22, No. 2, Apr. 1977, pp. 227-232.*

* cited by examiner

Primary Examiner—Phallaka Kik
(74) Attorney, Agent, or Firm—Cantor Colburn LLP; Cas Salys

(57) ABSTRACT

A method for identifying isomorphic cones with sub-linear resources by exploiting reflexivities, the method comprising: identifying a gate g1 and a gate g2 in a netlist; mapping source gates of g1 with any permutation of source gates of g2 by using calls to an isomorphism detection algorithm; determining whether a permutation exists of pairings between the gates sourcing g1 and g2; resetting pairing of gates if the permutation exists; and eliminating pairwise-identical source gates of g1 and g2.

8 Claims, 6 Drawing Sheets

```
bool is_isomorphic(gate g1, gate g2){
1.   if(mapping(g1)) return is_isomorphic(mapping(g1),g2);// exploit known
     redundancy
2.   if(mapping(g2)) return is_isomorphic(g1,mapping(g2));// exploit known
     redundancy
3.   if (g1= =g2) return TRUE;
4.   if ((GATE_TYPE(g1)!=GATE-TYPE(g2)){return FALSE;}
5.   if (#SOURCING_GATES(g1)!=#SOURCHING_GATES(g2)){return
     FALSE;}
6.   if (GATE_TYPE(g1)= =INPUT){return FALSE;}
7.   if ((visited(g1) || visited(g2)) &&(visited(g1)!=g2)){return FALSE;}
8.   visited(g1)=g2;
9.   visited(g2)=g1;
10.  eliminate pairwise-identical source gates of g1 and g2;
11.  try to map the remaining source gates of g1 with any permutation of
     remaining source gates of g2 using is_isomorphic calls;
12.  if we find a permutation {
13.  mapping(g1) =g2; // record known redundancy
14.  return TRUE;
15.  else reset all "visited" pairings attempted under this g1-g2 pairing;
}
```

FIGURE 1 bool is_isomorphic(gate g1, gate g2){

1. if (GATE_TYPE(g1)!=GATE_TYPE(g2)){return FALSE;}
2. if (#SOURCING *GATES(g1)!=#SOURCING*GATES(g2)){returnFALSE;}
3. if ((GATE_TYPE(g1)==INPUT)&&(g1 !=g2)){return FALSE;}//necessary for redundancy identification
4. if ((visited(g1) || visited (g2)) &&(visited(g1) !+g2)){return FALSE;}
5. visited(g1) = g2;
6. visited(g2) = g1;
7. try to map the source gates of g1 with any permutation of source gates g2 using is_isomorphic calls;
8. if we find a permutation, return TRUE;
9. else reset all "visited" pairings attempted under this g1-g2 pairing (i.e., during recursive calls to is_isomorphic in step 7); return FALSE;

}

FIGURE 4 bool is_isomorphic(gate g1, gate g2){

1. if (g1 = = g2) return TRUE; //enable super-linear performance by not analyzing the cones of g1 and g2 further
2. if (GATE_TYPE(g1) !=GATE_TYPE(g2)){return FALSE;}
3. if (#SOURCING_GATES(g1)!=#SOURCING_GATES(g2)){return FALSE;}
4. if (GATE_TYPE(g1)= =INPUT){return FALSE;}
5. if ((visited(g1) || visited(g2)) &&(visited(g1)!=g2)){return FALSE;}
6. visited(g1)=g2;
7. visited(g2)=g1;
8. eliminate pairwise-identifical source gates of g1 and g2; // another optimization to avoid analyzing reflexive pairings
9. try to map the remaining source gates of g1 with any permutation of remaining source gates of g2 using is_isomorphic calls;
10. if we find a permutation, return TRUE;
11. else reset all "visited" pairings attempted under this g1-g2 pairing.

FIGURE 5 bool is_isomorphic(gate g1, gate g2){

1. if(mapping(g1)) return is_isomorphic(mapping(g1),g2);// exploit known redundancy
2. if(mapping(g2)) return is_isomorphic(g1,mapping(g2));// exploit known redundancy
3. if (g1= =g2) return TRUE;
4. if ((GATE_TYPE(g1)!=GATE-TYPE(g2)){return FALSE;}
5. if (#SOURCING_GATES(g1)!=#SOURCHING_GATES(g2)){return FALSE;}
6. if (GATE_TYPE(g1)= =INPUT){return FALSE;}
7. if ((visited(g1) || visited(g2)) &&(visited(g1)!=g2)){return FALSE;}
8. visited(g1)=g2;
9. visited(g2)=g1;
10. eliminate pairwise-identical source gates of g1 and g2;
11. try to map the remaining source gates of g1 with any permutation of remaining source gates of g2 using is_isomorphic calls;
12. if we find a permutation {
13. mapping(g1) =g2; // record known redundancy
14. return TRUE;
15. else reset all "visited" pairings attempted under this g1-g2 pairing;

F(time_limit=INIT_TIME_LIMIT; time_limit,MAX_TIME_LIMIT; time_limit+= TIME_LIMIT_INCREMENT)
{
run is_isomorphic(g1, g2) for time_limit;
if is_isomorphic(g1, g2) returns a TRUE answer, return TRUE;
    - note: ignore FALSE answers, since is_isomorphic() may fail to identify redundant gates run is_equivalent(g1,g2,mapping) for time_limit;
if is_equivalent(g1,g2) returns a conclusive TRUE or FALSE answer, return that answer;
otherwise, for any gates in cone of g1 and g2 which are proven equivalent by
is_equivalent(g1, g2),
record those via mapping() to simplfy subsequent calls to is_isomorphic() and
is_equivalent();
{

_US 7,360,181 B2_

ENHANCED STRUCTURAL REDUNDANCY DETECTION

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to enhanced structural redundancy detection, and particularly to sequential redundancy identification algorithms for identifying gates within a sequential netlist.

2. Description of Background

Sequential redundancy identification algorithms have widespread applications, such as being the core techniques for sequential equivalence checking, and being critical to sequential design optimization techniques (for synthesis purposes).

A variety of techniques have been proposed for sequential redundancy identification. For example, one approach consists of first assuming all gates to be sequentially redundant, then performing an inductive fixed-point computation of iteratively forming smaller "buckets" of suspected-redundant pairs based upon failed equivalence-checking proofs. As another example, structural isomorphism approaches may be employed to attempt to identify gates, which must be sequentially redundant because of the structure of their cones of influence.

For instance, if gates g1 ... gn in the logic cones upon which gates h1 and h2 are constructed may be correlated 1:1 such that only gates of identical function are mapped to each other; gates gi and gj are correlated only if all of their inputs are correlated; and inputs in the cone of h1 and h2 can only be reflexively mapped, then it is assured that h1 and h2 are sequentially redundant. Isomorphism-based redundancy detection is lossy, in that two gates, which behave redundantly, may not have isomorphic cones. Nonetheless, isomorphism-based redundancy detection may be much faster than traditional semantic-analysis approaches.

A variety of techniques have been proposed for sequential redundancy identification. However, existing sequential redundancy identification techniques are slow and not scalable. It is desired to provide sequential identification techniques to advance the speed and scalability of sequential redundancy identification.

SUMMARY OF THE INVENTION

The shortcomings of the prior art are overcome and additional advantages are provided through the provision of a method for identifying isomorphic cones with sub-linear resources by exploiting reflexivities, the method comprising: identifying a gate g1 and a gate g2 in a netlist; mapping source gates of g1 with any permutation of source gates of g2 by using calls to an isomorphism detection algorithm; determining whether a permutation exists of pairings between the gates sourcing g1 and g2; resetting pairing of gates if no permutation of source gates g1 and g2 exists; and eliminating pairwise-identical source gates of g1 and g2.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which identifies isomorphic cones with sub-linear resources by exploiting reflexivities.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates one example of a traditional algorithm for redundancy identification through isomorphism detection;

FIG. 4 illustrates one example of a super-linear redundancy identification algorithm;

FIG. 5 illustrates one example of an improved super-linear redundancy identification algorithm; and FIG. 6 illustrates one example of a hybrid algorithm for redundancy detection using structural and semantic analysis.

The detailed description explains the preferred embodiments of the invention, together with advantages and features, by way of example with reference to the drawings.

DETAILED DESCRIPTION OF THE INVENTION

One aspect of the exemplary embodiments is a mechanism to identify isomorphic cones with sub-linear resources by exploiting reflexivities during the mapping process. Another aspect of the exemplary embodiments is a mechanism to speed up isomorphism detection by exploiting on the fly merging during the analysis. Another aspect of the exemplary embodiments is a mechanism to improve the performance and completeness of redundancy identification by intertwining semantic and structural approaches in an efficient resource-bounded manner.

Turning now to the drawings in greater detail, FIG. 1 illustrates a traditional algorithm for redundancy identification through isomorphism detection.

A netlist contains a directed graph with vertices representing gates, and edges representing interconnections between those gates. The gates have associated functions, such as constants, primary inputs, combinational logic such as AND gates, and sequential elements (e.g., registers). Registers have two associated components: their next-state functions, and their initial-value functions. Both are represented as other gates in the graph. Semantically, for a given register, the value appearing at its initial-value gate at time "0" ("initialization" or "reset" time) is applied as the value of the register itself; the value appearing at its next-state function gate at time "i" is applied to the register itself at time "I+1." Two gates h1 and h2 are said to be sequentially redundant if for every trace, comprising valuations to h1 and h2 over time which are consistent with the netlist semantics, h1 and h2 evaluate the same sequence of values.

Note that isomorphism detection algorithms are required to traverse the entire cone driving g1 and g2 before they are allowed to return a TRUE answer. This is generally required to ensure that there is a 1:1 mapping between the gates in the cone of g1 and g2, without which isomorphism is difficult. Second, due to the need to attempt all permutations of pairings between the gates sourcing g1 and g2, note that isomorphism detection generally requires exponential resources. Lastly step 3 of the algorithm of FIG. 1 is necessary only for algorithms which use isomorphism detection for redundancy identification, which is needed to ensure that not only are g1 and g2 implementing identical functions due to their isomorphic structures, but over an identical set of inputs.

Figure 2:
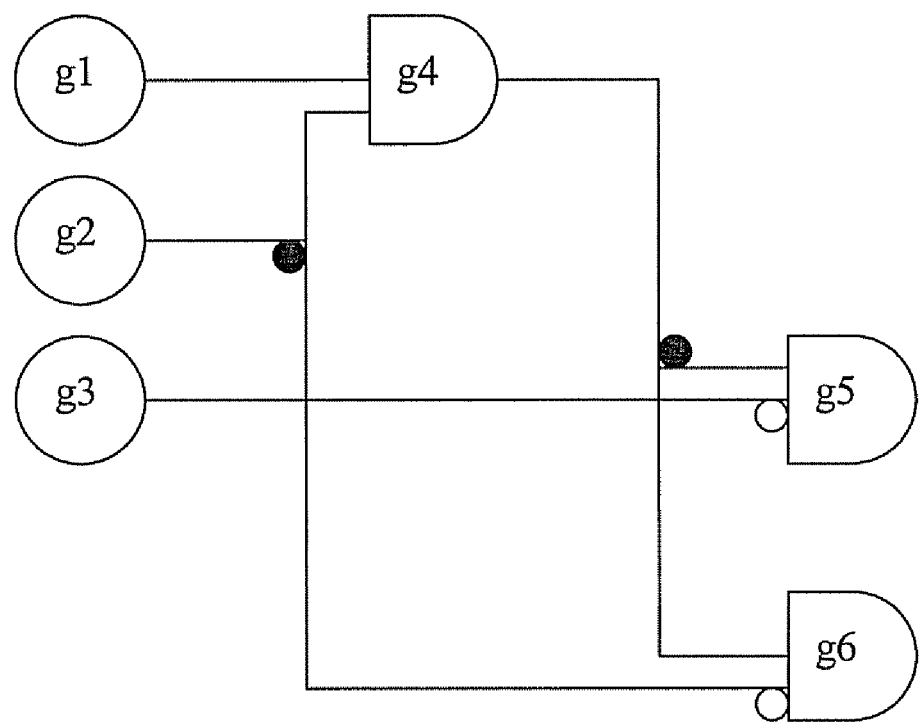
FIG. 2 illustrates one example of isomorphism detection that requires a 1:1 mapping.

Referring to FIG. 2, a mechanism to identify isomorphic cones with sub-linear resources by exploiting reflexivities during the mapping process is illustrated. This mechanism relies upon the observation that for redundancy-identification geared isomorphism checking, mapping gate g1 to g2 does not preclude mapping another gate g3 to g2. In traditional isomorphism-detection algorithms this would be disallowed. For example, consider the netlist of FIG. 2. Assume that identification of whether gates g5 and g6 are isomorphic. During this process, gates g4, the "top" source gate of both g5 and g6, is paired with itself; and gates g1 and g2, the source gates of g4, with themselves. However, in attempting to pair gate g3, the "bottom" source gate of g6, with g2, the "bottom" source gate of g5, this pairing attempt fails since g2 is already paired with itself. Gates g5 and g6 are not truly isomorphic, nor are they redundant, since g6 is a gate, which cannot evaluate to 1 (since it is an AND expression over both g2 and NOT (g2)). In contrast, gate g5 may evaluate to both 0 and 1 since it does not have such an expression.

Figure 3:
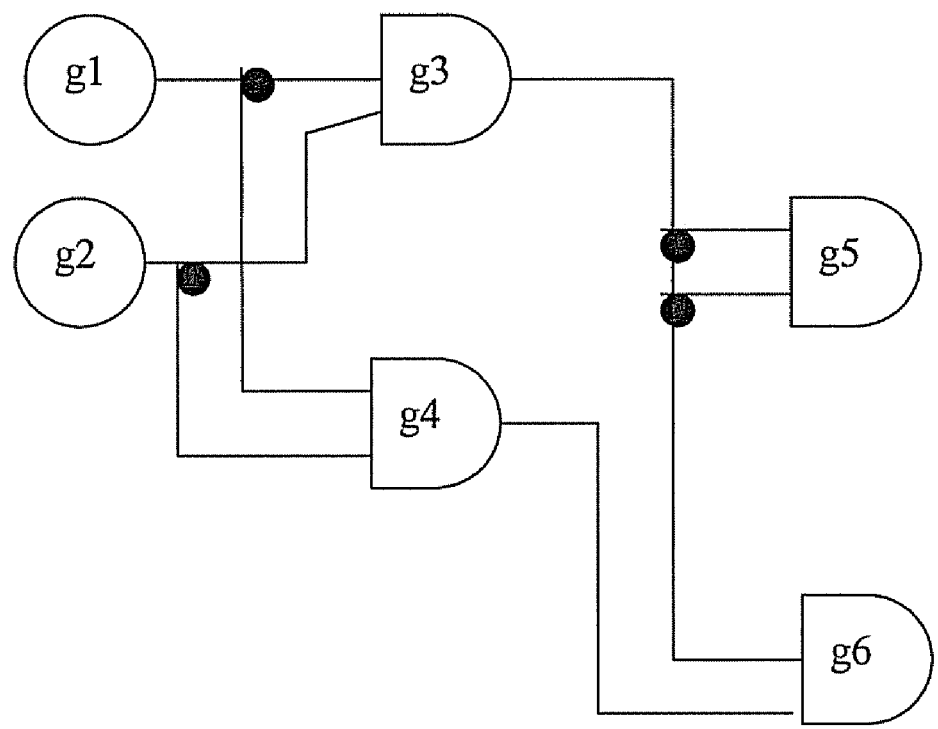
FIG. 3 illustrates one example of isomorphism detection for redundant gate identification that allows n:1 mapping between redundant gates.

Referring to FIG. 3, there are certain conditions in which mappings may safely be n:1 while preserving isomorphism. Consider the netlist of FIG. 3. Assume that it is desired to check the isomorphism of gates g5 and g6. During this process, gate g3, the "top" source gate of both g5 and g6, is paired with itself. However, when attempting to pair the "bottom" source gates of g5 and g6, a conflict arises and g3 cannot be paired with g4 because g3 is already paired with itself. Nonetheless, if this pairing were allowed, it would succeed in allowing isomorphism detection to detect that g5 and g6 are truly redundant; both implement function (g1 AND g2).

Referring to FIG. 4, the reasons why in some cases a 1:1 gate mapping is not necessary for the use of isomorphism for redundancy detection, is due to the fact that it is safe to enable n:1 mappings among redundant gates. For example, it is safe to map g3 to both g3 and g4 in FIG. 3. This observation allows the modification of the algorithm of FIG. 1 to effectively neglect recording reflexive mappings, which enables n:1 mappings in cases to identify redundancy, as in the example of FIG. 3. This also enables the algorithm to run in super-linear time in cases, i.e., it need not even touch every gate in the cone of g1 and g2 once, if g1==g2.

Furthermore, with regards to FIG. 4 a mechanism to achieve further speedups through on the fly merging is illustrated. The modified redundancy identification algorithm of FIG. 4 has two distinct benefits. First, it enables substantial performance benefits by avoiding the traversal of "reflexive" cones where g1==g2, and further exploits this performance boost by reordering permutations of possible recursive calls to prune identical source gates. Second, it enables the algorithm to identify certain redundant gates which require n:1 mappings vs. flagging those as irredundant as would be the case with traditional algorithms, as per FIG. 1. An additional extension to the algorithm of FIG. 4, which further exploits these benefits, is described in FIG. 5.

Referring to FIG. 5, in identifying redundant gates, it is safe to map any redundant gates to each other, whereas the extension of FIG. 1 only allows at most a 2:1 mapping: the reflexive mapping, and one other arbitrary redundant mapping. A mechanism that enables true n:1 mapping is described in FIG. 5.

The algorithm of FIG. 5 offers several improvements over that of FIG. 4. First, it "remembers" gates that were previously demonstrated to be redundant through the "mapping" field. In particular, if it is demonstrated that g1 and g2 are redundant, this is recorded in step 13 of the algorithm. Later, while attempting to assess redundancy of gates which may have g1 and g2 in their fan-in, this recording is exploited in steps 1 and 2 of the algorithm to basically treat all gates that have been demonstrated to be redundant with g1 as if they were g1, enabling a true n:1 redundant gate identification paradigm.

Second, this recording enables further speedups to the process due to step 3, which precludes traversing reflexive cones. Whereas in the algorithm of FIG. 4, the cone of g1 is not traversed only when attempting to pair g1 with g3, provided that g1 and g3 were previously identified as being redundant. This enables iterative and incremental speedups to the redundancy identification process as more and more gates in the cones of the top-level gate pair under analysis are determined to be redundant.

Referring to FIG. 6, an efficient mechanism to improve the performance and completeness of redundancy detection via a resource-constrained iteration between semantic and structural analysis is illustrated. This aspect leverages the observation raised in FIG. 2, that gages identified as redundant during earlier phases of analysis can be used to simplify later analysis. It further improves upon the solution of FIG. 2 by leveraging the use of semantic algorithms to identify redundant gates, which may not be identifiable as such via structural analysis.

Semantic analysis is often more expensive than structural isomorphism analysis. For instance, the approach of FIG. 1 requires refinement iterations based upon failed proof attempts. In other words, each proof attempt may require exponential resources, and there may be a linear number of proof attempts (one per gate in the cone of g1 and g2).

Also, the identification of redundant gates simplifies the structural analysis of subsequent gates in terms of run-time improvements (since reflexive traversals are neglected), and in enabling the identification of gates which are redundant but not in a readily-identifiable structural way (due to necessary n:1 pairings to enable structural redundancy identification).

Algorithm is_equivalent(g1,g2,mapping) uses any semantic approach for attempting to prove the equivalence gates g1 and g2. Passing "mapping" into this algorithm only serves to simplify the analysis therein, by flagging the gates within the cones of g1 and g2 which were previously identified as redundant by either the structural analysis (e.g., from a prior call to is_isomorphic) or semantic analysis (e.g., from a prior call to is_equivalent). This algorithm iterates between the semantic and structural algorithms in an increasing-resource fashion, ultimately yielding a conclusive result with minimal resources. This is because for many problems, structural analysis is faster than semantic; though in others, we have the opposite solution. So leveraging both algorithms together renders an optimal solution with minimal resources.

Furthermore, for some gates in the sub-cones of g1 and g2, one approach may outperform the other and for other gates in the same sub-cones, the other may hold true. Therefore, the hybrid approach may yield exponentially faster results than either standalone approach, as would be the limits with traditional approaches.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for identifying isomorphic cones with sub-linear resources by exploiting reflexivities, the method comprising:
   identifying a gate g1 and a gate g2 in a netlist;
   mapping source gates of g1 with any permutation of source gates of g2 by using calls to an isomorphism detection algorithm;
   determining whether a permutation exists of pairings between the gates sourcing g1 and g2;
   resetting pairing of gates if no permutation of source gates g1 and g2 exists; and
   eliminating pairwise-identical source gates of g1 and g2.

2. The method of claim 1, wherein there is an n:1 mapping of the gates of g1 and of the gates of g2.

3. The method of claim 1, wherein the isomorphism detection algorithm runs in super linear time.

4. The method of claim 1, wherein the isomorphism detection algorithm re-orders permutations of possible recursive calls to reduce identical source gates.

5. The method of claim 1, wherein the isomorphism detection algorithm identifies redundant gates requiring n:1 mappings.

6. The method of claim 1, wherein the isomorphism detection algorithm is a hybrid algorithm for redundancy detection by using a combination of a structural analysis and a semantic analysis.

7. The method of claim 6, wherein the isomorphism detection algorithm iterates between the structural analysis and the semantic analysis in an increase-resource manner to yield redundant detections with minimal resources.

8. The method of claim 1, wherein the isomorphism detection algorithm remembers gates g1 and g2 previously demonstrated to be redundant and exploits this information when trying to demonstrate redundancy of gates h1 and h2 which have gates g1 and g2 in their cone of influence.

* * * * *